(12) United States Patent
Chin (10) Patent No.: US 10,892,085 B2
(45) Date of Patent: Jan. 12, 2021

(54) CIRCUIT BOARD ASSEMBLIES HAVING MAGNETIC COMPONENTS

(71) Applicant: Astec International Limited, Kowloon (HK)

(72) Inventor: Kwong Kei Chin, Fremont, CA (US)

(73) Assignee: Astec International Limited, Kowloon (HK)

( * ) Notice: Subject to any disclaimer, the term of this patent is extended or adjusted under 35 U.S.C. 154(b) by 401 days.

(21) Appl. No.: 15/832,415

(22) Filed: Dec. 5, 2017

(65) Prior Publication Data

US 2018/0166203 A1    Jun. 14, 2018

Related U.S. Application Data

(60) Provisional application No. 62/432,125, filed on Dec. 9, 2016.

(51) Int. Cl.
| | |
|---|---|
| *H01F 5/00* | (2006.01) |
| *H01F 27/28* | (2006.01) |
| *H01F 41/02* | (2006.01) |
| *H01F 27/24* | (2006.01) |
| *H01F 27/29* | (2006.01) |
| *H05K 1/02* | (2006.01) |
| *H05K 1/18* | (2006.01) |

(52) U.S. Cl.
CPC ......... *H01F 27/2804* (2013.01); *H01F 27/24* (2013.01); *H01F 27/29* (2013.01); *H01F 41/02* (2013.01); *H05K 1/0256* (2013.01); *H01F 2027/2819* (2013.01); *H05K 1/181* (2013.01); *H05K 2201/09063* (2013.01); *H05K 2201/1003* (2013.01)

(58) Field of Classification Search
CPC ........... H01F 27/2804; H01F 2019/085; H01F 2027/065; H01F 27/324
USPC ......................................................... 336/200
See application file for complete search history.

(56) References Cited

U.S. PATENT DOCUMENTS

| | | | | |
|---|---|---|---|---|
| 5,124,888 | A * | 6/1992 | Suzuki ................... | H05B 41/02 361/740 |
| 6,028,894 | A * | 2/2000 | Oishi ................... | H04B 1/1027 375/227 |
| 6,373,736 | B2 | 4/2002 | Matsumoto et al. | |
| 7,132,921 | B2 * | 11/2006 | Eguchi ................ | H01F 27/2804 336/200 |
| 7,427,910 | B2 * | 9/2008 | Mehrotra ............ | H01F 27/2804 336/200 |

(Continued)

*Primary Examiner* — Elvin G Enad
*Assistant Examiner* — Joselito S. Baisa (57) ABSTRACT

According to some aspects of the present disclosure, circuit board assemblies and methods of circuit board assembly are disclosed. Example circuit board assemblies include a circuit board and a magnetic component coupled to the circuit board. The magnetic component includes a primary winding and a secondary winding. The assembly also includes a winding interconnect terminal electrically coupled to the magnetic component. The winding interconnect terminal is disposed on the circuit board remote from the magnetic component, and the circuit board defines an air gap between the winding interconnect terminal and the magnetic component to provide electrical isolation between the winding interconnect terminal and the magnetic component. Corresponding methods of assembling circuit boards and magnetic components are also disclosed.

18 Claims, 3 Drawing Sheets

(56) References Cited

U.S. PATENT DOCUMENTS

| | | | | |
|---|---|---|---|---|
| 7,724,115 B2* | 5/2010 | Chen | ...................... | H01F 27/326 336/131 |
| 7,872,561 B2* | 1/2011 | Matumoto | .......... | H01F 27/2804 336/200 |
| 7,889,041 B2* | 2/2011 | Minteer | .............. | H01F 27/2804 336/200 |
| 7,920,039 B2 | 4/2011 | Shabany et al. | | |
| 8,169,286 B2* | 5/2012 | Hasegawa | ................ | H01F 38/14 336/200 |
| 8,344,838 B2* | 1/2013 | Park | ........................ | H01F 27/06 336/65 |
| 8,928,449 B2* | 1/2015 | Silva | ........................ | H01F 3/14 336/200 |
| 9,035,737 B2* | 5/2015 | Nanayakkara | .......... | H01F 19/04 336/200 |
| 10,388,449 B2* | 8/2019 | Park | .................... | H01F 27/2823 |
| 2008/0088401 A1* | 4/2008 | Wei | ........................ | H01F 27/289 336/182 |
| 2008/0253149 A1* | 10/2008 | Matumoto | .......... | H01F 27/2804 363/21.06 |
| 2009/0096562 A1* | 4/2009 | Nakadai | .................. | H01F 38/42 336/67 |
| 2010/0219926 A1* | 9/2010 | Willers | ............... | H01F 27/2804 336/200 |
| 2010/0238072 A1* | 9/2010 | Ayatollahi | ................ | H01Q 1/48 343/700 MS |
| 2013/0170258 A1* | 7/2013 | Calvin | ...................... | H01F 5/04 363/64 |
| 2013/0257575 A1* | 10/2013 | Timashov | ........... | H01F 27/2847 336/200 |

\* cited by examiner

CIRCUIT BOARD ASSEMBLIES HAVING MAGNETIC COMPONENTS

CROSS-REFERENCE TO RELATED APPLICATIONS

This application claims the benefit and priority of U.S. Provisional Application No. 62/432,125, filed on Dec. 9, 2016. The entire disclosure of the above application is incorporated herein by reference.

FIELD

The present disclosure relates to circuit board assemblies having magnetic components, and methods of assembling circuit boards.

BACKGROUND

This section provides background information related to the present disclosure which is not necessarily prior art.

Circuit boards may have spacing distance requirements between components due to applicable regulatory standards related to safety, reliability, etc. Magnetic components of the circuit boards can have increased spacing requirements when the magnetic components include exposed outer layer windings, exposed magnetic cores, high voltage differentials with respect to external interconnection terminals, etc. In some cases, regulatory standards may require a smaller separation distance when air is present between two electrical components as compared to a required separation distance when a circuit board material is present between two electrical components.

SUMMARY

This section provides a general summary of the disclosure, and is not a comprehensive disclosure of its full scope or all of its features.

According to one aspect of the present disclosure, a circuit board assembly includes a circuit board and a magnetic component coupled to the printed circuit board. The magnetic component includes a primary winding and a secondary winding. The assembly also includes a winding interconnect terminal electrically coupled to the magnetic component. The winding interconnect terminal is disposed on the circuit board remote from the magnetic component. The circuit board defines an air gap between the winding interconnect terminal and the magnetic component to provide electrical isolation between the winding interconnect terminal and the magnetic component.

According to another aspect of the present disclosure, a method of assembling a circuit board and a magnetic component is disclosed. The method includes coupling a magnetic component to a printed circuit board. The magnetic component includes a primary winding and a secondary winding. The method further includes electrically coupling a winding interconnect terminal to the magnetic component via at least one conductive trace disposed in an inner layer of the circuit board, positioning the winding interconnect terminal on a surface of the circuit board remote from the magnetic component, and forming an air gap in the circuit board between the magnetic component and the winding interconnect terminal to provide electrical isolation between the winding interconnect terminal and the magnetic component.

Further aspects and areas of applicability will become apparent from the description provided herein. It should be understood that various aspects and features of this disclosure may be implemented individually or in combination with one or more other aspects or features. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding features throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 1:
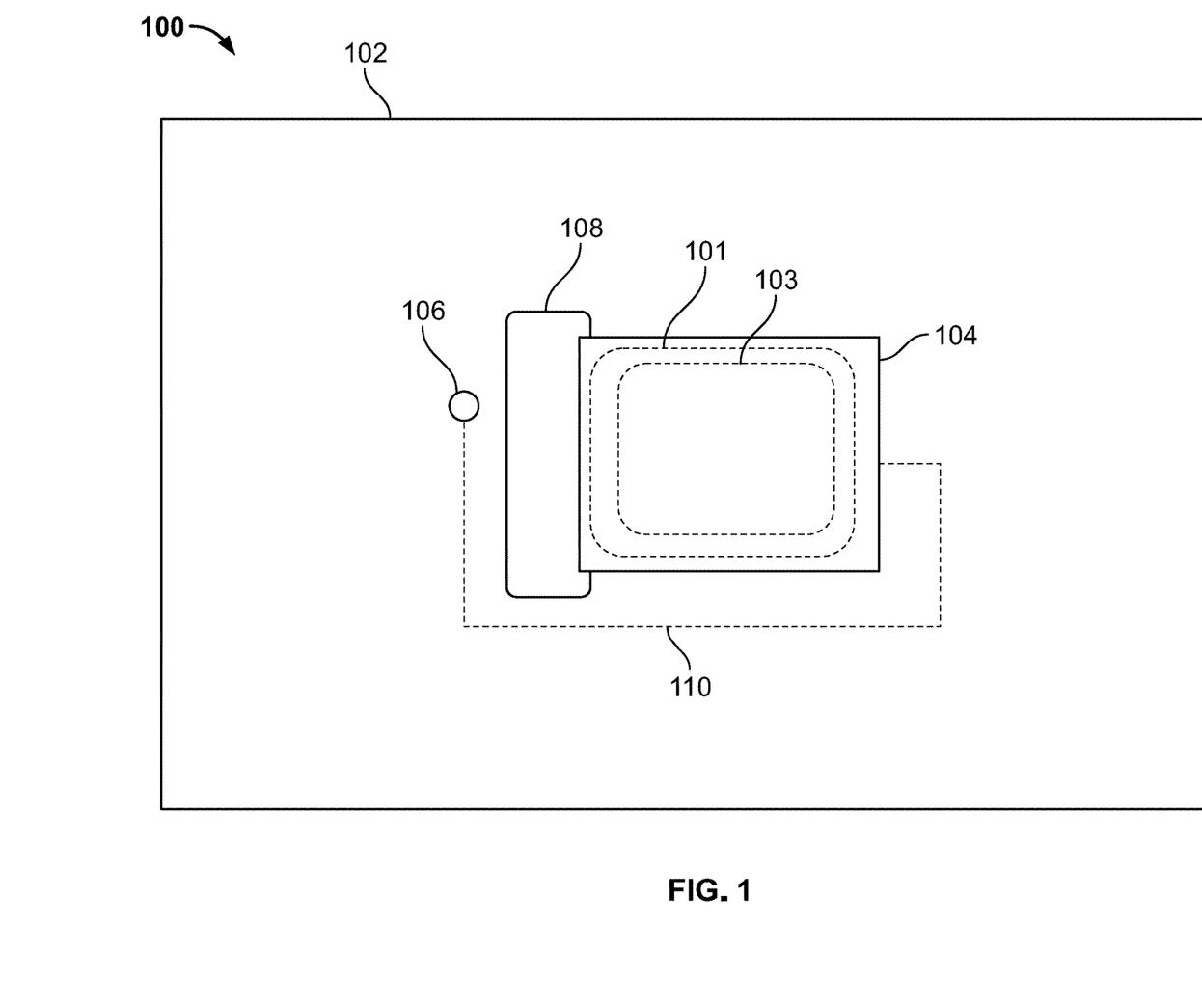
FIG. 1 is a block diagram of a circuit board assembly according to one example embodiment of the present disclosure.

A printed circuit board assembly according to one example embodiment of the present disclosure is illustrated in FIG. 1 and indicated generally by reference number 100. As shown in FIG. 1, the circuit board assembly 100 includes a circuit board 102 and a magnetic component 104. The magnetic component 104 includes at least one primary winding 101 and at least one secondary winding 103.

The assembly 100 also includes a winding interconnect terminal 106 electrically coupled to the magnetic component 104. The winding interconnect terminal 106 is disposed on the circuit board 102 remote from the magnetic component 104.

The circuit board 102 defines an air gap 108 between the winding interconnect terminal 106 and the magnetic component 104. The air gap 108 provides electrical isolation between the winding interconnect terminal 106 and the magnetic component 104.

The circuit board 102 can be any suitable circuit board capable of supporting electrically coupled circuit components, defining conductive circuit traces, etc. In some embodiments, the circuit board 102 may be a printed circuit board (e.g., a board having conductive traces, printed, deposited, etc. on a surface of the board).

The magnetic component 104 may include any suitable magnetic component capable of generating, storing, transferring, etc. electrical and/or magnetic currents and/or voltages. For example, the magnetic component 104 may include a transformer, an inductor, etc.

As mentioned above, the magnetic component 104 includes at least one primary winding 101 and at least one secondary winding 103. The magnetic component may be a planar magnetic component (e.g., a planar transformer, a planar inductor, etc.), where one or more of the windings of the magnetic component are arranged in a same plane, in parallel planes, etc. As shown in the example embodiment illustrated in FIG. 1, the primary winding 101 and secondary winding 103 are positioned in a stacked configuration below the top surface of magnetic component 104 (as indicated by the dashed lines).

For example, the primary winding 101 may be a planar winding arranged in a single plane (e.g., a flat winding, etc.). Similarly, the secondary winding 103 may be a planar winding arranged in a single plane (e.g., a flat winding, etc.). The primary winding 101 and secondary winding 103 can be arranged in the magnetic component 104 in separate planes that are parallel to one another, such that the primary winding 101 and the secondary winding 103 do not intersect, do not wrap around one another, etc.

In some embodiments, the primary and secondary winding(s) may be arranged in one or more inner and/or outer winding layers of the magnetic component 104. For example, the primary and secondary winding(s) may be comprised in multiple planar winding layers that are stacked in a sandwich layer arrangement, an interleaved layer arrangement, etc.

In some embodiments, the inner and outer winding layers of the magnetic component 104 may be substantially symmetrical, such that the magnetic component 104 includes a top outer winding layer on a top side of the magnetic component 104 (which may correspond to a top side of the circuit board 102), and a bottom outer winding layer on a bottom side of the magnetic component 104 (which may correspond to a bottom side of the circuit board 102).

The circuit board 102 may include one or more inner layers disposed between the outer surfaces of the circuit board 102. In some embodiments, the circuit board 102 includes electrical insulation between the inner layers of the circuit board 102.

The assembly 100 includes a conductive trace 110 electrically coupled between the winding interconnect terminal 106 and the magnetic component 104. The conductive trace 110 may be any suitable electrically conductive material, deposit, wire, etc. capable of electrically coupling the winding interconnect terminal 106 and the magnetic component 104. For example, the conductive trace 110 may be a conductive trace disposed on an inner layer of circuit board 102.

The conductive trace 110 may be coupled to one of the primary and/or secondary windings of the magnetic component 104. For example, the conductive trace 110 may form an interconnection (e.g., a via, etc.) that extends outwards from (e.g., exits, etc.) the magnetic component 104 and is coupled to winding interconnect terminal 106. Accordingly, conductive trace 110 may form an interconnection for one of the primary and/or secondary winding(s) of the magnetic component 104 by allowing one of the primary and/or secondary windings to be coupled to external winding interconnect terminal 106.

In some cases, the external winding interconnect terminal 106 may be required to have a greater separation distance from the magnetic component 104 than a required distance of separation between windings in inner layers of the magnetic component 104 (e.g., because inner layers of magnetic component 104 may have electrical insulation layers, etc.).

The air gap 108 provides increased electrical isolation between the outer layer winding and core of the magnetic component 104 and the exposed winding interconnect terminal 106, which may have a high voltage differential therebetween.

As an example, if the outer winding layer of the magnetic component 104 includes secondary winding 103, the winding interconnect terminal 106 may be electrically coupled to the primary winding 101 of the magnetic component 104. The exposed winding interconnect terminal 106 (e.g., a connection pad, a printed circuit board outer layer trace, etc.)

is separated from the secondary winding 103 and core of the magnetic component 104 by the air gap 108 in the circuit board 102.

As another example, if the outer winding layer of the magnetic component 104 is a primary winding 101, the air gap 108 in the circuit board 102 will separate an exposed secondary winding interconnect terminal 106 from the primary winding 101 of the magnetic component 104.

In some embodiments, insulation may be added in the air gap 108 to further increase electrical isolation between the winding interconnect terminal 106 and the magnetic component 104. For example, insulation may be applied to a surface of a magnetic core of the magnetic component 104 that extends into the air gap 108. Alternatively, or additionally, insulation may be applied to a winding structure of the magnetic component 104 that extends into the air gap 108.

As described above, positioning the air gap 108 between the winding interconnect terminal 106 and the magnetic component 104 increases electrical isolation between the winding interconnect terminal 106 and the magnetic component 104. This allows the winding interconnect terminal 106 to be positioned closer to the magnetic component 104 on the circuit board 102, while maintaining a threshold amount of electrical isolation between the winding interconnect terminal 106 and the magnetic component 104 to meet electrical isolation requirements.

Accordingly, the air gap 108 can allow the winding interconnect terminal 106 to be moved closer to the magnetic component 104 than would otherwise be permitted without the air gap 108. In some embodiments, the point-to-point distance between the winding interconnect terminal 106 and the magnetic component 104 across the air gap meets (e.g., is greater than or equal to) regulatory standards for air gap electrical isolation distance, and the shortest path on the circuit board between the winding interconnect terminal 106 and the magnetic component 104 meets regulatory standards for circuit board surface electrical isolation distance.

For example, some requirements (e.g., regulations, safety standards, etc.) may require a distance of at least about eight millimeters between the winding interconnect terminal 106 and the magnetic component 104 when a continuous circuit board surface is present between the winding interconnect terminal 106 and the magnetic component 104.

The air gap 108 allows the winding interconnect terminal 106 to be moved closer to the magnetic component 104. For example, in some embodiments the shortest distance between the winding interconnect terminal 106 and the magnetic component 104 may be less than about eight millimeters. Preferably, the distance between the winding interconnect terminal 106 and the magnetic component 104 may be less than or equal to about two millimeters. As should be apparent, other distances between the winding interconnect terminal 106 and the magnetic component 104 may be used without departing from the scope of the present disclosure.

The width of the air gap 108 may correspond to the distance between the winding interconnect terminal 106 and the magnetic component 104. For example, the width of the air gap 108 may be less than about eight millimeters, may be less than or equal to about two millimeters, etc.

The reduction in distance between the winding interconnect terminal 106 and the magnetic component 104 can allow for smaller circuit board designs, smaller power converters that include the circuit board assembly 100, etc.

As mentioned above, an insulation barrier may be positioned in the air gap 108 between the between the winding interconnect terminal 106 and the magnetic component 104. The insulation barrier may comprise any suitable insulating material capable of increasing electrical isolation between the winding interconnect terminal 106 and the magnetic component 104. For example, the insulation barrier may include, but is not limited to, insulation lining, a multi-side barrier formed by one or more dielectric components, etc.

The winding interconnect terminal 106 can be any terminal suitable for making an electrical connection between printed circuit board traces, wires, etc. For example, the winding interconnect terminal 106 may include a printed circuit board surface pad, a printed circuit board surface trace, a conductive via, etc.

The conductive trace 110 can be any suitable connection for electrically coupling the winding interconnect terminal 106 to the magnetic component 104. For example, the conductive trace 110 may be an inner layer trace of the printed circuit board 102. The trace 110 may be shielded by layers of the printed circuit board (e.g., insulating nonconductive layers, etc.).

Although FIG. 1 illustrates the air gap 108 as being slightly longer than one side of the magnetic component 104, it should be apparent that other embodiments may include air gap(s) 108 that are the same length as a side of the magnetic component 104, are a shorter length than a side of the magnetic component 104, are positioned adjacent multiple sides of the magnetic component 104, etc. For example, the air gap 108 may be positioned adjacent at least two sides of the magnetic component 104, at least three sides of the magnetic component 104, etc.

Figure 2:
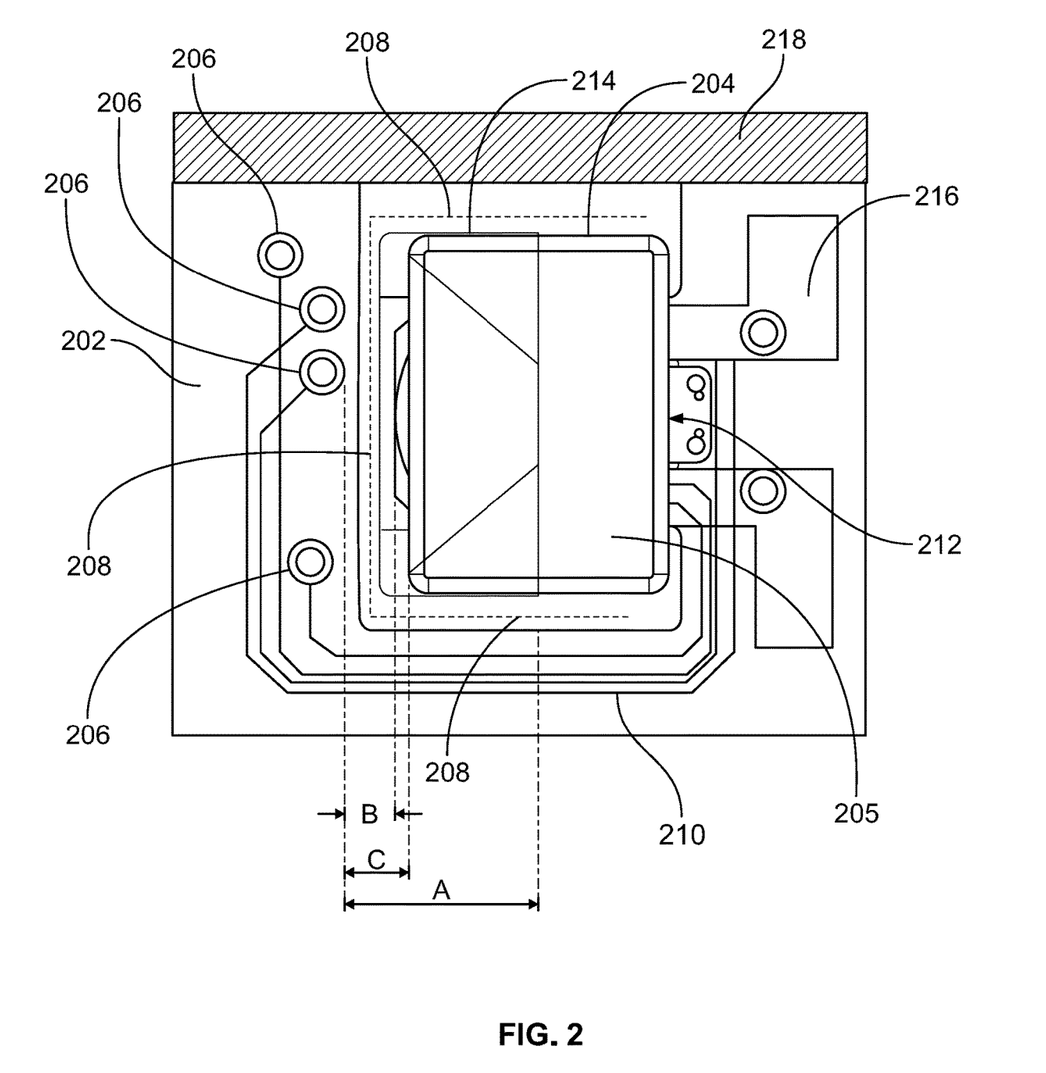
FIG. 2 is a top view of a circuit board assembly defining an air gap adjacent three sides of a magnetic component, according to another example embodiment of the present disclosure.

FIG. 2 illustrates a printed circuit board assembly 200, which is similar to the printed circuit board assembly 100 of FIG. 1. As shown in FIG. 2, the printed circuit board assembly 200 includes a printed circuit board 202 and a planar magnetic component 204 coupled to the printed circuit board 202.

The planar magnetic component 204 includes top and bottom outer winding layers (not shown), which are occupied by the secondary winding of the planar magnetic component 204. The planar magnetic component 204 also includes a core 205.

As shown in FIG. 2, the air gap 208 is defined on three sides of the planar magnetic component 204. Only one side 212 of the planar magnetic component 204 is coupled to the printed circuit board 202, which may be a secondary side of the printed circuit board 202 (e.g., a side of the printed circuit board 202 coupled to secondary circuit 216, etc.).

The primary winding of the planar magnetic component 204 extends from (e.g., exits, etc.) the same side 212 where the component 204 is physically coupled to the printed circuit board 202, while the traces 210 coupling the primary winding to terminals 206 are sealed in inner layers of the printed circuit board 202. The traces 210 are routed from where they exit the planar magnetic component on the secondary side of the printed circuit board 202, back to the primary side of the printed circuit board 202 (e.g., a side of the printed circuit board coupled to an input of a power converter, etc.) where the primary winding interconnect terminals 206 are located.

The air gap 208 defined on the three sides of the planar magnetic component 204 provides physical separation between the planar magnetic component 204 and the primary winding interconnect terminals 206, which allows for reduced distance between the planar magnetic component 204 and the primary winding interconnect terminals 206.

An optional insulation barrier 214 may be used to further increase isolation between the planar magnetic component 204 and the primary winding interconnect terminals 206, which can allow for even further reduced distance between the planar magnetic component 204 and the primary winding interconnect terminals 206.

As shown in FIG. 2, the optional insulation barrier 214 at least partially covers the overhanging winding layer and core of the planar magnetic component 204. This allows for a reduction of the minimum creepage distance A required by regulatory standards to maintain a minimum amount of isolation between the non-insulated portion of planar magnetic component 204 and the primary winding interconnect terminals 206. The minimum distance A may be reduced without imposing a minimum requirement on the spacing between the primary and secondary winding (dimension B), or imposing a minimum requirement on the spacing between the primary winding and the core (dimension C). Therefore, the overall size of the printed circuit board 202 can be significantly reduced.

As described above, the insulation barrier 214 may include any suitable insulation material, including but not limited to, a wrapping of insulation lining, a multi-side barrier structure formed by one or more dielectric components, etc. Although FIG. 2 illustrates the insulation barrier as covering a portion of the planar magnetic component 204, other embodiments may include insulation barrier(s) disposed in other parts of the air gap 208, on other portions of the planar magnetic component 204, etc.

The assembly 200 also includes an exposed secondary circuit 216 on an outer layer of the printed circuit board 202. The exposed secondary circuit 216 is coupled to a secondary winding of the planar magnetic component 204, and extends from the planar magnetic component 204 at a same side 212 as the primary trace 210.

The assembly 200 further includes an optional extension 218 of the printed circuit board 202, which may allow for passage of additional primary traces along inner layers of the printed circuit board 202.

Figure 3:
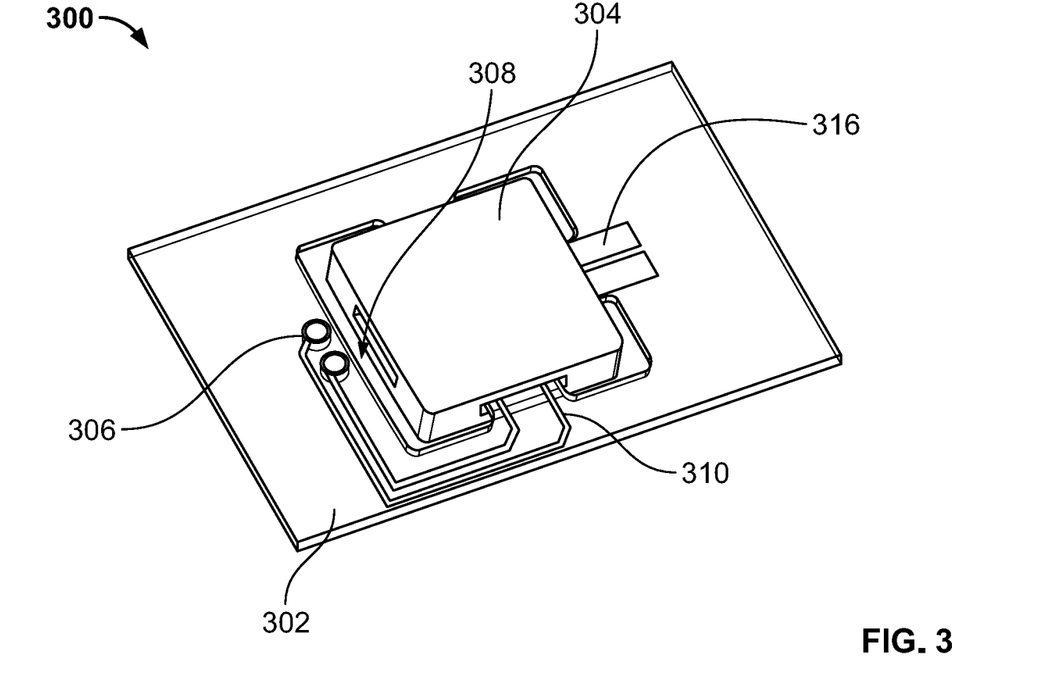
FIG. 3 is a perspective view of a circuit board assembly having conductive traces extending from different sides of a magnetic component, according to yet another example embodiment of the present disclosure.

Some planar magnetic component may have two openings for winding exits, four openings for winding exits, etc. FIG. 3 illustrates a printed circuit board assembly 300 where the planar magnetic component 304 includes four openings for winding exits (of which only two of the openings have windings extending therefrom). As shown in FIG. 3, the primary winding traces 310 extend from the planar magnetic component 304 on a different side than where the secondary circuit 316 extends from the planar magnetic component 304.

The primary traces 310 are routed back to the primary side of the printed circuit board 302 along inner layers of the printed circuit board 302, where they are coupled to primary winding interconnect terminals 306.

An air gap 308 is positioned between the primary winding interconnect terminals 306 and the planar magnetic component 304. This air gap 308 may have a width sufficient to provide enough electrical isolation to meet regulatory requirements, while allowing for a smaller distance between the primary winding interconnect terminals 306 and the planar magnetic component 304 (as compared to components not separated by an air gap).

Although the examples described herein are related to high voltage differentials between primary and secondary windings, it should be apparent that other embodiments may have high voltage differentials between other winding combinations of the magnetic component, without departing from the scope of the present disclosure. For example, some magnetic components may have high voltage differential(s) between multiple secondary windings, between multiple primary windings, etc. In cases where the core of the magnetic component has more than two openings for windings to extend, multiple openings can be used to accommodate multiple sets of windings that require separation from other sets of windings.

Figure 4:
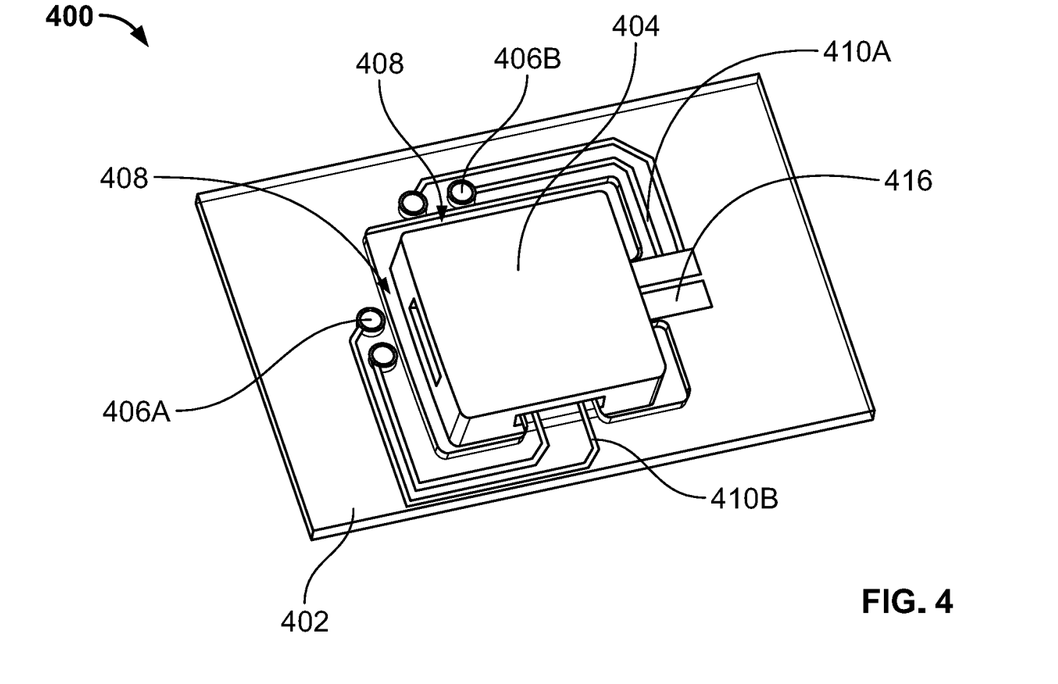
FIG. 4 is a perspective view of another circuit board assembly having conductive traces exiting different sides of a magnetic component, according to a further example embodiment of the present disclosure.

For example, FIG. 4 illustrates a printed circuit board assembly 400 including a planar magnetic component 404 having four openings for winding traces. The planar magnetic component 404 includes a secondary winding, a primary winding A, and a primary winding B, which each require separation from one another.

As shown in FIG. 4, the primary winding A interconnect terminals 406A are coupled to one side of the planar magnetic component 404 via primary winding A traces 410A. The primary winding B interconnect terminals 406B are coupled to another side of the planar magnetic component 404 via primary winding B traces 410B. The primary winding A traces 410A and primary winding B traces 410B are routed to different sides of the printed circuit board 402 via inner layers of the printed circuit board 402.

Secondary circuit 416 is disposed on an outer layer of the printed circuit board 402. Secondary circuit 416 extends from the planar magnetic component 404 on a same side as the primary winding A trace 410A.

The air gap 408 provides separation between the primary winding A interconnect terminals 406A and the primary winding B interconnect terminals 406B. Accordingly, the air gap 408 can provide sufficient isolation between primary windings A and B, the secondary winding, and the core of the planar magnetic component 404.

Printed circuit board assemblies described herein may be used in any suitable applications, particularly where size reduction of the printed circuit board assembly is desired. For example, printed circuit board assemblies described herein may be used in power supplies, power transformers, isolation signal transformers, etc. In one embodiment, a flyback converter (e.g., a 3W flyback converter, etc.) includes one or more of the printed circuit board assemblies described herein.

Printed circuit board assemblies described herein may provide one or more (or none) of the following advantages: size reduction of the printed circuit board assembly, increased isolation between a winding interconnect terminal and a magnetic component, reduced distance between a winding interconnect terminal and a magnetic component (e.g., from about eight millimeters to about two millimeters, etc.) due to an air gap in the printed circuit board (and optionally an insulation barrier disposed in the air gap, coupled to the magnetic component, etc.), cost savings based on reduced printed circuit board size, etc.

In another embodiment, a method of assembling a circuit board and magnetic component is disclosed. The method includes coupling a magnetic component to a printed circuit board. The magnetic component includes a primary winding and a secondary winding. The method also includes coupling a winding interconnect terminal to the magnetic component via at least one trace disposed in an inner layer of the printed circuit board, positioning the winding interconnect terminal on a surface of the circuit board remote from the magnetic component, and forming an air gap in the circuit board between the magnetic component and the winding interconnect terminal to provide electrical isolation between the winding interconnect terminal and the magnetic component.

The air gap may be shaped as necessary to achieve a required voltage isolation spacing at a smaller distance than a typical spacing, resulting in a reduced overall printed circuit board size.

Positioning the winding interconnect terminal may include positioning the winding interconnect terminal less than about eight millimeters from the magnetic component (or positioning the component less than about eight millimeters from the terminal), and may further include positioning the winding interconnect terminal less than or equal to about two millimeters from the magnetic component (or positioning the component less than or equal to about two millimeters from the terminal).

In some embodiments, the method may include positioning an insulation barrier in the air gap between the winding interconnect terminal and the magnetic component.

Any of the example embodiments and aspects disclosed herein may be used in any suitable combination with any other example embodiments and aspects disclosed herein without departing from the scope of the present disclosure. For example, circuit board assemblies described herein may be assembled using other assembly methods, the assembly methods described herein may be used to assemble other circuit board assemblies, etc., without departing from the scope of the present disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A circuit board assembly comprising:
   a circuit board including an inner layer;
   a magnetic component coupled to the circuit board, the magnetic component including a primary winding and a secondary winding;
   a winding interconnect terminal electrically coupled to one of the primary winding and the secondary winding of the magnetic component, the winding interconnect terminal disposed on the circuit board remote from the magnetic component, and the circuit board defining an air gap between the winding interconnect terminal and the magnetic component to provide electrical isolation between the winding interconnect terminal and the other of the primary winding and the secondary winding of the magnetic component;
   at least one conductive trace disposed in the inner layer of the circuit board and coupled between the winding interconnect terminal and the primary winding of the magnetic component; and
   wherein the at least one conductive trace extends from the magnetic component on a first side of the magnetic component and the winding interconnect terminal is located on a second side of the magnetic component opposite the first side.

2. The assembly of claim 1, wherein the magnetic component includes a planar magnetic component having at least one winding wound in a single plane.

3. The assembly of claim 2, wherein the magnetic component includes a transformer.

4. The assembly of claim 2, wherein the magnetic component includes an inductor.

5. The assembly of claim 1, wherein the magnetic component includes at least one inner winding layer and at least one outer winding layer.

6. The assembly of claim 1, wherein the winding interconnect terminal is positioned less than eight millimeters from the magnetic component.

7. The assembly of claim 6, wherein the winding interconnect terminal is positioned less than or equal to two millimeters from the magnetic component.

8. The assembly of claim 1, further comprising an insulation barrier disposed in the air gap defined by the circuit board.

9. The assembly of claim 8, wherein the insulation barrier includes at least one of an insulation lining and a multi-side barrier comprising one or more dielectric components.

10. The assembly of claim 1, wherein the air gap defined by the circuit board is located on the second side of the magnetic component opposite the first side where the at least one conductive trace extends from the magnetic component.

11. The assembly of claim 1, wherein the circuit board defines the air gap adjacent at least two sides of the magnetic component.

12. The assembly of claim 1, wherein the circuit board defines the air gap adjacent at least three sides of the magnetic component.

13. The assembly of claim 1, wherein the at least one conductive trace is a first conductive trace coupled to the primary winding, the assembly further comprising a second conductive trace coupled to the secondary winding and extending from the magnetic component on a surface of the circuit board on the same side of the magnetic component as the first conductive trace coupled to the primary winding.

14. The assembly of claim 1, wherein the at least one conductive trace is a first conductive trace coupled to the primary winding, the assembly further comprising a second conductive trace coupled to the secondary winding and extending from the magnetic component on a surface of the circuit board on the different side of the magnetic component than the first conductive trace.

15. The assembly of claim 1, wherein the primary winding is a first primary winding, the at least one conductive trace is coupled to the first primary winding, and the magnetic component includes a second primary winding, the assembly further comprising a second conductive trace coupled to second primary winding, the first conductive trace and the second conductive trace extending from the magnetic component on different sides of the magnetic component.

16. A method of assembling a circuit board and a magnetic component, the method comprising:
   coupling a magnetic component to a circuit board, the magnetic component including a primary winding and a secondary winding;
   electrically coupling a winding interconnect terminal to one of the primary winding and the secondary winding of the magnetic component via at least one conductive trace disposed in an inner layer of the circuit board;
   positioning the winding interconnect terminal on a surface of the circuit board remote from the magnetic component; and
   forming an air gap in the circuit board between the magnetic component and the winding interconnect terminal to provide electrical isolation between the winding interconnect terminal and the other of the primary winding and the secondary winding of the magnetic component;

wherein the at least one conductive trace extends from the magnetic component on a first side of the magnetic component; and wherein the winding interconnect terminal is positioned away from a second side of the magnetic component opposite the first side.

17. The method of claim 16, wherein positioning the winding interconnect terminal includes positioning the winding interconnect terminal less than or equal to two millimeters from the magnetic component.

18. The method of claim 16, further comprising positioning an insulation barrier in the air gap between the winding interconnect terminal and the magnetic component.

* * * * *